US012225701B1

(12) United States Patent
Goodman et al.

(10) Patent No.: US 12,225,701 B1
(45) Date of Patent: Feb. 11, 2025

(54) ELECTROMAGNETIC AND RADIATION SHIELDING USING NANOFORESTS

(71) Applicants: Goodman Technologies LLC, Albuquerque, NM (US); University of Hawai'i, Honolulu, HI (US)

(72) Inventors: William A. Goodman, Albuquerque, NM (US); Mohammad Naghi Ghasemi-Nejhad, Honolulu, HI (US); Brenden M. Minei, Honolulu, HI (US); Caleb Pierick, Honolulu, HI (US)

(73) Assignees: Goodman Technologies LLC, Albuquerque, NM (US); University of Hawai'i, Honolulu, HI (US)

( * ) Notice: Subject to any disclaimer, the term of this patent is extended or adjusted under 35 U.S.C. 154(b) by 387 days.

(21) Appl. No.: 17/696,652

(22) Filed: Mar. 16, 2022

Related U.S. Application Data

(60) Provisional application No. 63/161,669, filed on Mar. 16, 2021.

(51) Int. Cl.
*H05K 9/00* (2006.01)
*G21F 1/10* (2006.01)

(52) U.S. Cl.
CPC .......... *H05K 9/0083* (2013.01); *G21F 1/106* (2013.01); *H05K 9/0088* (2013.01)

(58) Field of Classification Search
CPC ..... H05K 9/0083; H05K 9/0088; G21F 1/106
See application file for complete search history.

(56) References Cited

U.S. PATENT DOCUMENTS 3,878,872 A  4/1975  Hintsch
4,561,802 A  12/1985 Campo
(Continued)

FOREIGN PATENT DOCUMENTS

WO  2008060294 A2  5/2008
WO  2011106109 A2  9/2011
(Continued)

OTHER PUBLICATIONS

Dexter, H. B., et al., "Impact resistance and interlaminar fracture toughness of through-the-thickness reinforced graphite/epoxy", 27th AIAA Structural Dynamics and Materials Conference, AIAA Paper 86-1020, 1986, 700-709.

(Continued)

*Primary Examiner* — Nicole M Ippolito
(74) *Attorney, Agent, or Firm* — Philip D. Askenazy; Peacock Law P.C.

(57) ABSTRACT

A lightweight radiation shielding material. A carbon nanotube forest is embedded in a matrix comprising nanoparticulates, such as nanoparticles, carbon nanotubes, or graphene nanosheets. The nanoparticulates can be low atomic number (low-Z) or high atomic number (high-Z). The matrix can be a solidified polymer, epoxy, resin, or ceramic precursor, for example silicon carbide. The radiation shield can shield an object from radio frequency interference (RFI), lightning, electromagnetic interference (EMI), an electromagnetic pulse (EMP), gamma rays, X-rays, neutrons, and/or protons. The nanoforest is disposed on a conductive base with sufficient in-plane electrical conductivity to provide an effective conductive path for currents induced by radiation absorption. The base can be a second nanoforest comprising horizontally-oriented carbon nanotubes, which makes the shield particularly lightweight, as low as 10% of the mass of aluminum that provides equivalent shielding. The base can be adhered to an object to be shielded.

17 Claims, 4 Drawing Sheets

(56) References Cited

U.S. PATENT DOCUMENTS

| | | | |
|---|---|---|---|
| 7,658,870 | B2 | 2/2010 | Nejhad et al. |
| 7,875,212 | B2 | 1/2011 | Nejhad et al. |
| 8,148,276 | B2 | 4/2012 | Nejhad et al. |
| 8,349,404 | B2 | 1/2013 | Resasco et al. |
| 9,120,908 | B2 | 9/2015 | Russ et al. |
| 10,894,718 | B2 | 1/2021 | Huynh |
| 11,084,724 | B2 | 8/2021 | Huynh |
| 2008/0018012 | A1 | 1/2008 | Lemaire et al. |
| 2008/0159944 | A1 | 7/2008 | Park |
| 2008/0170982 | A1 | 7/2008 | Zhang et al. |
| 2010/0272891 | A1 | 10/2010 | Malecki et al. |
| 2012/0273118 | A1 | 11/2012 | Jiang et al. |
| 2013/0216811 | A1 | 8/2013 | Ghasemi-Nehjad et al. |
| 2018/0127709 | A1* | 5/2018 | Mukhopadhyay ...... C23C 16/56 |
| 2018/0305212 | A1 | 10/2018 | Huynh |
| 2019/0177167 | A1 | 6/2019 | Huynh |
| 2021/0139332 | A1 | 5/2021 | Garg et al. |
| 2021/0340012 | A1 | 11/2021 | Huynh |
| 2023/0264960 | A1 | 8/2023 | Ghasemi-Nejhad et al. |

FOREIGN PATENT DOCUMENTS

| | | |
|---|---|---|
| WO | 2021216160 A2 | 10/2021 |
| WO | 2022011320 A1 | 1/2022 |

OTHER PUBLICATIONS

Ghasemi Nejhad, M. N., "Multifunctional Hierarchical Nanocomposite Laminates for Automotive/Aerospace Applications", Multi-Functionality of Polymer Composites: Challenges and New Solutions-Applications in Transportation, K. Friedrich and U. Breuer, Eds., Elsevier Publications, Waltham, MA, USA, 2015, 491-526.

Askari, Davood, et al., "Effects of vertically aligned carbon nanotubes on shear performance of laminated nanocomposite bonded joints", Sc. Techno. Adv. Mater., vol. 13, 2012.

"Nano Adaptive Hybrid Fabric (NAHF-X)", www.udri.udayton.edu, 2015.

Ando, Y., et al., "Growing Carbon Nanotubes", Materials Today, vol. 7, 2004, 22-29.

Ando, Y., et al., "Preparation of Carbon Nanotubes by Arc-discharge Evaporation", Japanese Journal of Applied Physics, vol. 32, 1993, L107-L109.

Ando, Y., et al., "Production of Ultrafine Powder of [Beta]-Sic by Arc Discharge", Journal of Crystal Growth, vol. 60, 1982, 147-149.

Andrews, R., et al., "Continuous Production of Aligned Carbon Nanotubes: a Step Closer to Commercial Realization", Chemical Physics Letters, vol. 303, 1999, 467-474.

Askari, D., "Analytical, Numerical, and Experimental Investigations on Effective Mechanical Properties and Performances of Carbon Nanotubes and Nanotube Based Nanocomposites with Novel Three Dimensional Nanostructures", PhD Dissertation, Department of Mechanical Engineering, University of Hawaii at Manoa, 2009.

Beiruck, M. J., et al., "Carbon nanotube composites for thermal management", Applied Physics Letters, vol. 15, 2002, 2767-2769.

Calvert, P., "Nanotube composites: a recipe for strength", Nature, vol. 399, 1999, 210-211.

Cao, A., et al., "Multifunctional Brushes Made from Carbon Nanotubes", Nature Materials, vol. 4, 2005, 540-545.

Cao, A., et al., "Super-compressible foam-like films of carbon nanotubes", Science, vol. 310, 2005, 1307-1310.

Cheng, H. M., et al., "Bulk Morphology and Diameter Distribution of Single-walled Carbon Nanotubes Synthesized by Catalytic Decomposition of Hydrocarbons", Chemical Physics Letters, vol. 289, 1998, 602-610.

Dai, H., et al., "Single-wall Nanotubes Produced by Metal-catalyzied Disproportionation of Carbon Monoxide", Chemical Physics Letter, vol. 260, 1996, 471-475.

Dee, Nicholas T., et al., "In situ mechanochemical modulation of carbon nanotube forest growth", Chemistry of Materials 31.2, Dec. 15, 2018, 407-418.

Dow, M. B., et al., "Development of stitched, braided and woven composite structures in the ACT program and at Langley Research Center", NASA Technical Report, NASA/TP-97-206234, http://techreports.larc.nasa.gov/ltrs/PDF/1997/tp/NASA-97-tp206234.pdf, 1997.

Endo, M., et al., "The Production and Structure of Pyrolytic Carbon Nanotubes (PCNTs)", Journal of Physics and Chemistry of Solids, vol. 54, 1993, 1841-1848.

Flauhaut, E., et al., "Synthesis of Single-walled Carbon Nanotubes Using Binary (Fe, Co, Ni) Alloy Nanoparticles Prepared In-situ by the Reduction of Oxide Solid Solutions", Chemical Physics Letters, vol. 300, 1999, 236-242.

Ghasemi Nejhad, M N., "Hierarchical Multifunctional Nanocomposites", Behavior and Mechanics of Multifunctional Materials and Composites VIII (SSN04), Nakhiah C. Goulbourne and Hani E. Naguib, Eds., Proc. of SPIE's 21st International Conference on Smart Structures/NDE, Conference 9058, vol. SS14-SSN04-27, Paper SSN04-9058-7, 2014, 905807-1-16.

Hafner, J. H., et al., "Catalytic Growth of Single-wall Carbon Nanotubes from Metal Particles", Chemical Physics Letters, vol. 296, 1998, 195-202.

Hata, K., et al., "Water-Assisted Highly Efficient Synthesis of Impurity-Free Single-Walled Carbon Nanotubes", Science, vol. 306, 2004, 1362-1364.

Hernadi, K., et al., "Large Scale Synthesis of Carbon Nanotubes", Carbon, vol. 34, No. 10, 1996, 1249-1261.

Huang, H., et al., "Aligned carbon nanotube composite films for thermal management", Advanced Materials, vol. 17, 2005, 1652-1656.

Iijima, S., "Helical Microtubules of Graphitic Carbon", Nature, vol. 354, 1991, 56-58.

Jose-Yacaman, M., et al., "Catalytic Growth of Carbon Microtubules with Fullerene Structure", Applied Physics Letters, vol. 62, 1993, 657-659.

Kashani, H., et al., "Unprecedented Electromagnetic Interference Shielding from Three-Dimensional Bi-continuous Graphene", Matter, vol. 1, 2019, 1077-1087.

Khosroshahi, K., et al., "Processing and characterization of nanopartices and carbon nanotube reinforced continuous fiber ceramic nanocomposites by preceramic polymer pyrolysis", SPIE Conference on Optomechanics and Optical Manufacturing; Material Technologies and Applications to Optics, Structures, Components, and Sub-Systems IV (Conference OP304), San Diego, CA., Ref. No. OP304-18, Paper 11101-4, 2019, 1-13.

Kong, J., et al., "Chemical Vapor Deposition of Methane for Single-walled Carbon Nanotubes", Chemical Physical Letters, vol. 292, 1998, 567-574.

Koratkar, N., et al., "Carbon Nanotube films for damping applications", Advanced Materials, vol. 14, 2002, 997-1000.

Liu, Q., "Recent developments in the Flame-Retardant System of Epoxy Resin", Materials, vol. 13, 2020, 1-39.

Mouritz, S. P., "Fracture and tensile fatigue properties of stitched fiberglass composites", Journal of Materials: Design and Applications, vol. 218, 2004, 87-93.

Nuismer, R. J., et al., "Uniaxial Fracture of Composite Laminates Contaning Stress Concentrations", Fracture Mechanics of Composites, ASTM STP 593, American Society of Testing and Materials, 1975, 117.

Park, Y. T., et al., "Epoxy Toughening with Low Graphene Loading", Advanced Functional Materials, vol. 25, No. 4, Jan. 28, 2015, 575-585.

Pipes, R. B., et al., "Notched Strength of Composites Materials", Journal of Composite Materials, vol. 13, 1979, 148-160.

Saini, P., et al., "Enhanced microwave absorption behavior of polyaniline-CNT/polystyrene blend in 12.4-18.0 GHz range", Synthetic Metals, vol. 161, 2011, 1522-1526.

Satishkumar, B. C., et al., "Bundles of Aligned Carbon Nanotubes Obtained by the Pyrolysis of Ferrocene-Hydrocarbon Mixtures: Role of the Metal Nanoparticles Produced In-situ", Chemical Physics Letters, vol. 307, 1999, 158-162.

(56) References Cited

OTHER PUBLICATIONS

Satishkumar, B. C., et al., "Single-walled Nanotubes by the Pyrolysis of Acetylene-organometallic Mixtures", Chemical Physics Letters, vol. 293, 1998, 47-52.
Schadler, L. S., et al., "Load transfer in carbon nanotube epoxy composites", Applied Physics Letter, vol. 73, No. 26, 1998, 3842-3844.
Suhr, J. , et al., "Viscoelasticity in carbon nanotube composites", Nature Materials, vol. 4, 2005, 134-137.
Tai, N. H., et al., "Enhancement of the Mechanical Properties of Carbon Nanotube/Phenolic Composites Using a Carbon Nanotube Network as the Reinforcement", Carbon., vol. 42, 2004, 774-777.
Takagi, D. , et al., "Single-Walled Carbon Nanotube Growth from Highly Activated Metal Nanoparticles", Nano Letters, vol. 6, 2006, 2642-2645.
Thostenson, E. T., et al., "Nanocomposites in Context", Composites Sci. and Tech, vol. 65, 2005, 491-516.
Veedu, V. P., et al., "Multifunctional composites using reinforced laminae with carbon-nanotube forests", Nature Materials, vol. 5, 2006, 457-462.
Whitney, J. M., et al., "Stress Fracture Criteria for Laminated Composites Containing Stress Concentrations", Journal of Composite Materials, vol. 8, 1974, 253-265.
Zhou, W. , et al., "Copper Catalyzing Growth of single-Walled Carbon Nanotubes on Substrates", Nano Letters, vol. 6, 2006, 2987-2990.

\* cited by examiner

ELECTROMAGNETIC AND RADIATION SHIELDING USING NANOFORESTS

CROSS-REFERENCE TO RELATED APPLICATIONS

This application claims priority to and the benefit of the filing of U.S. Provisional Patent No. 63/161,669, entitled "Electromagnetic and Radiation Shielding Using Nanoforests", filed on Mar. 16, 2021, the entirety of which is incorporated herein by reference.

BACKGROUND OF THE INVENTION

Field of the Invention (Technical Field)

The present invention is related to the use of carbon nanotube (CNT) nanoforests embedded in a matrix comprising nanoparticulates to enhance the absorption and shielding of electromagnetic (EM) and other radiation.

BACKGROUND ART

Note that the following discussion may refer to a number of publications and references. Discussion of such publications herein is given for more complete background of the scientific principles and is not to be construed as an admission that such publications are prior art for patentability determination purposes.

A nuclear EMP is a complex electromagnetic multi-pulse. A high altitude nuclear burst (HEMP) event includes three waveforms: E1 (early-time), E2 (intermediate-time), and E3 (late-time). The "combined" frequency range for HEMP and environmental effects extends from about 10 kHz to several GHz, however, per MIL-STD-461G, >92% of HEMP energy is delivered below 100 MHz. There are several components and phenomenology for shielding: 1) $SE_{Magnetic}=A+R_{Magnetic}-C_{Magnetic}$; 2) $SE_{Electric}=A+R_{Electric}-C_{Electric}$; and 3) $SE_{PlaneWave}=A+R_{PlaneWave}-C_{PlaneWave}$, where SE is the Shielding Effectiveness, A is the Absorption Loss, R is the Reflection Loss, and C is the Re-Reflection Correction. The primary mechanism of shielding is reflection and depends upon the electrical conductivity of the shield. The secondary mechanism of shielding is absorption, which requires the presence of electric or magnetic dipoles. The industry norm uses a conductive shell of Al or Cu to form a Faraday cage. This approach typically delivers at best about 40-50 dB of SE and has three major disadvantages: 1) considering the wide frequency range of HEMP, for most applications 40-50 dB SE is not enough attenuation; 2) there is a substantial weight penalty, since a higher SE value requires a thicker conductive material with a greater number of skin depths, which means a heavier shield; and 3) the Faraday cage still has conductive and aperture penetrations into the protected volume that need be dealt with.

SUMMARY OF THE INVENTION (DISCLOSURE OF THE INVENTION)

An embodiment of the present invention is a radiation shield comprising a nanoforest comprising vertically-oriented carbon nanotubes, the nanoforest embedded in a matrix comprising nanoparticulates. The nanoparticulates are preferably nanoparticles, carbon nanotubes, or graphene nanosheets. The nanoparticulates optionally comprise one or more materials selected from the group consisting of graphene, modified graphene, functionalized graphene oxide, gold, silver, copper, aluminum, and platinum. The matrix preferably comprises a solidified polymer, epoxy, resin, or ceramic precursor. The nanoparticulates are preferably low atomic number (low-Z). The radiation shield is preferably capable of shielding an object from radio frequency interference (RFI) (e.g., 5G), lightning, microwave transmissions, electromagnetic radiation, electromagnetic interference (EMI), electromagnetic pulse (EMP), High-altitude Electromagnetic Pulse (HEMP), Vertical EMP (VEMP), flash X-rays, gamma rays, X-rays, and/or neutrons. The radiation shield optionally comprises high atomic number (high-Z) nanoparticulates, thereby enabling the radiation shield to shield an object from protons. The matrix preferably comprises a ceramic, preferably silicon carbide. The concentration of nanoparticulates in the matrix is preferably greater than approximately 3.2 wt %, more preferably greater than approximately 30 wt %, and even more preferably greater than about 60 wt %. The vertically-oriented carbon nanotubes are preferably between about 25 microns and about 4 mm in length. The nanoforest is preferably disposed on a base. The base preferably comprises sufficient in-plane electrical conductivity to provide an effective conductive path for currents induced by radiation absorption. The base preferably comprises a second nanoforest comprising horizontally-oriented carbon nanotubes. The thickness of the second nanoforest is preferably between about 40 microns and about 70 microns. The base is preferably configured to adhere to an object to be shielded. The radiation shield preferably comprises approximately 10% of a mass of aluminum providing equivalent shielding.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings.

DETAILED DESCRIPTION OF EMBODIMENTS OF THE INVENTION

Embodiments of the present invention comprise a hierarchical, multifunctional, 3-dimensional nanocomposite with a structured 3D carbon nanotube (CNT)/graphene nanosheet (GNS) labyrinthine structure having a high shielding effectiveness (SE) suitable for shielding and radiation hardening avionics, data centers, and other high valued terrestrial or airborne electronics systems preferably from radio frequency interference (RFI) (e.g., 5G), lightning, microwave transmissions, other sources of electrical magnetic interference (EMI), electromagnetic pulse (EMP), High-altitude Electromagnetic Pulse (HEMP), Vertical EMP (VEMP), flash X-rays, and even some nuclear effects due to, for example, HEMP, gamma rays, X-rays, and neutrons.

Figure 1:
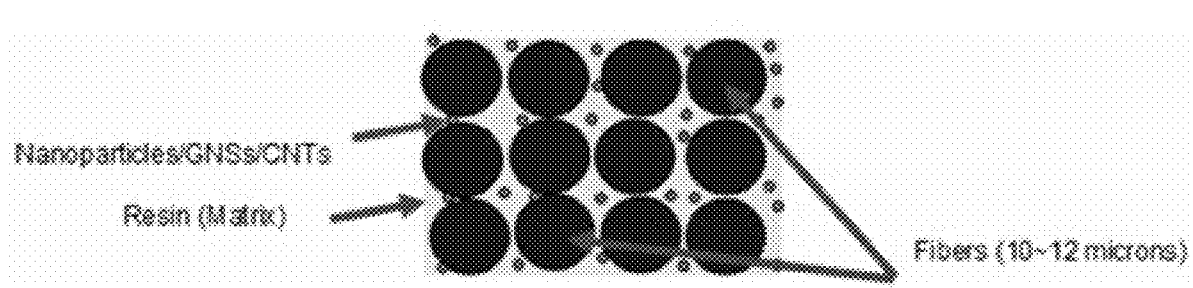
FIG. 1 is a top view schematic of an embodiment of the nanoresin technology of the present invention (figure not to scale).

In the 3D CNT/GNS labyrinthine structure of the present invention, impinging electromagnetic (EM) waves experience multiple internal reflections, volumetrically enhancing the EM wave absorption by conversion of induced currents to heat and other mechanisms. As shown in FIG. 1, the nanocomposite preferably comprises a vertically-aligned carbon nanotube (CNT) nanoforest embedded in a conductive or insulating matrix (comprising, e.g., a solidified polymer, epoxy, resin, etc.) that comprises electrically conductive nanoparticulates. As used throughout the specification and claims, the term "nanoparticulates" means any nanoscale structures such as nanoparticles, carbon nanotubes, graphene nanosheets (GNS), and the like. The nanoparticulates can comprise any material, for example graphene, modified graphene, functionalized graphene oxide, gold, silver, copper, aluminum, platinum, etc. For Low Earth Orbit (LEO) or other space or extraterrestrial environments (e.g. lunar, other planets, other celestial bodies), the invention preferably provides extremely lightweight, low-Z shielding against naturally occurring space radiation effects, where Z means atomic number. Additions of high-Z nanoparticulates to the matrix preferably provides additional shielding against high-energy protons in the solar wind or trapped in the van Allen belts. The terms low-Z and high-Z are well understood by those skilled in the art of radiation shielding. The vertically-aligned CNT nanoforest preferably comprises nanotubes of any length (in some embodiments from about 25 microns to about 4 mm) or diameter, and preferably provides a 3D trap for EM radiation by causing multiple reflections between neighboring CNTs and the nanoparticulate matrix in the transverse direction (i.e. through the thickness) of the composite. The increased mean free path for propagation of EM waves through the labyrinthine structure preferably volumetrically enhances EM absorption.

In one embodiment an epoxy matrix comprises low-Z graphene nanosheets (GNS), preferably comprising functionalized graphene oxide (GO). The nanoresin is preferably manufactured by sonication of Jeffamine hardener with additions of highly conductive graphene, GNS, and/or graphene oxide (GO), which are then preferably combined with EPON 828, to form a composition comprising a resin having a reinforcement dispersed within, the reinforcement comprising graphene bodies, carbon nanotubes, or any combination thereof. This compositing improves structural and physical (e.g. electrical and thermal conductivity) properties isotropically, but typically to a lesser extent than the nanoforest(s).

Figure 3A:
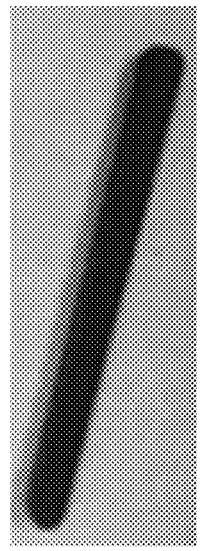
FIG. 3A is a photograph of a sample with 60 wt % graphene nanosheets (GNS) in SMP-10, as-cured.
Figure 3B:
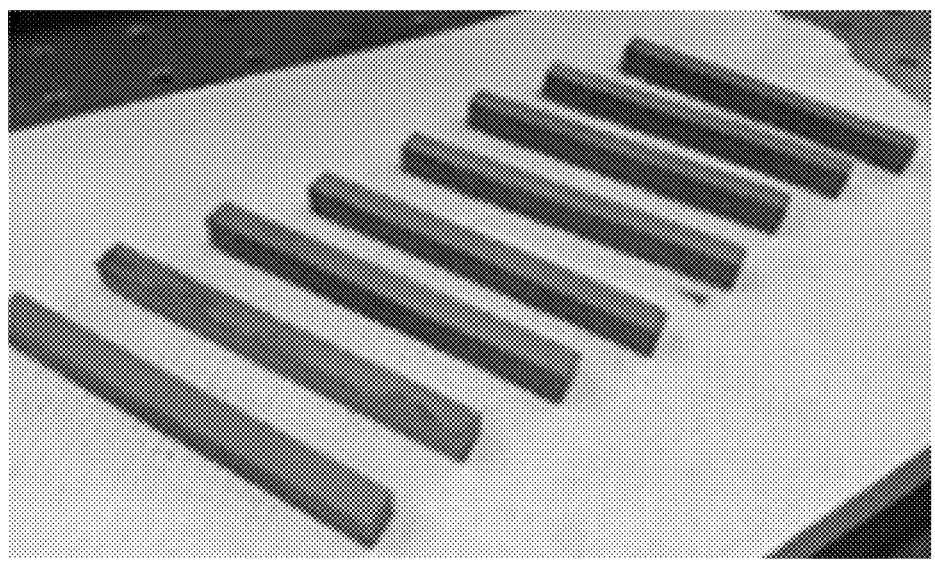
FIG. 3B is a photograph of samples with 30 wt % carbon nanotubes (CNTs) in SiC ceramic.

Other surfactants and solvents can be used to make hyper-loaded nanoresins (i.e. resins loaded with nanoparticulates) to turn electrical insulators into conductors better than steel. The percolation threshold (defined here as the point when the electrical conductivity reaches 0.00005 S/cm) for both CNT and GNS in preceramic polymers comprising electrically insulating silicon carbide (e.g. Starfire Systems' SMP-10) is approximately 3.2 wt %. An as-cured 60 wt % GNS nanocomposite, shown in FIG. 3A, had a conductivity of 1.7 S/cm, better than steel. Composites comprising 30 wt % CNT in a SiC ceramic, shown in FIG. 3B, have a conductivity of 3.86 S/cm. These can be wire electrical discharge machined (EDM) to make ¼×80 bolts with 0.25 mm pitch threads. These GNS/SiC and CNT/SiC nanoceramic composite materials are suitable for high temperature hypersonics. With epoxy matrices, the GNS and CNTs will also promote flame retardancy, helping to assure that flammability/smoke/toxicity (FST) requirements are met.

Figure 2:
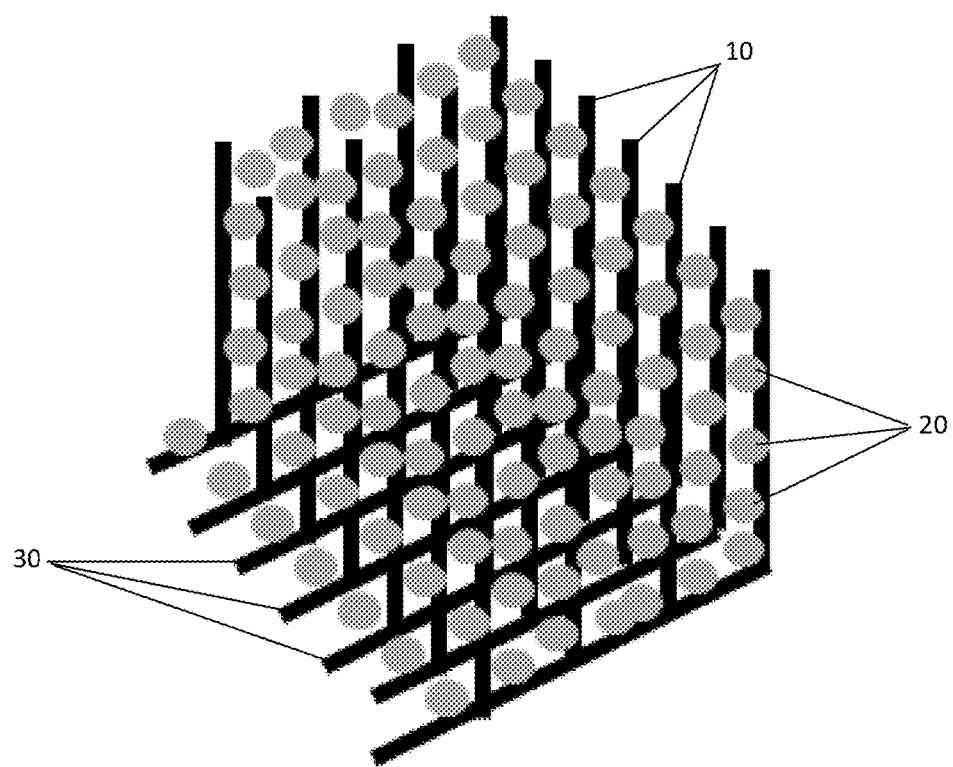
FIG. 2 shows a perspective view schematic of an embodiment of the nanoresin technology of the present invention (figure not to scale).

The vertically-aligned CNT nanoforest is preferably disposed on a conductive base. The base preferably both provides sufficient conductivity in the in-plane direction to provide a conductive path for induced currents resulting from EM absorption. As shown in FIG. 2, in some embodiments CNTs 10 comprising the vertical nanoforest and the matrix comprising nanoparticulates 20 is disposed on a nanoforest base comprising horizontally-aligned CNTs 30 to form an orthogonal nanoforest, as disclosed in International Patent Application No. PCT/US21/15588, filed on Jan. 28, 2021, entitled "Orthogonal Carbon Nanotube-Based Nanoforest For High Performance Hierarchical Multifunctional Nanocomposites", incorporated herein by reference. The horizontally-aligned CNT nanoforest preferably has a thickness of between about 40 microns and about 70 microns and is preferably lighter weight than a typical solid conductive base. The base can be adhered to any object for shielding, including fibers, prepregs, fabric plies, wearables, avionics vaults, other composite material systems, etc., either on the surface or between plies, braids, or weaves. The substrate can comprise any material, including but not limited to T300 epoxy, aluminum, titanium, steel or plastic. As used throughout the specification and claims, the term "vertically-oriented" means the CNTs in the nanoforest are approximately perpendicular to the surface of the object to be shielded, and the term "horizontally-oriented" means that the CNTs in the nanoforest are approximately parallel to the surface of the object to be shielded.

Figure 4:
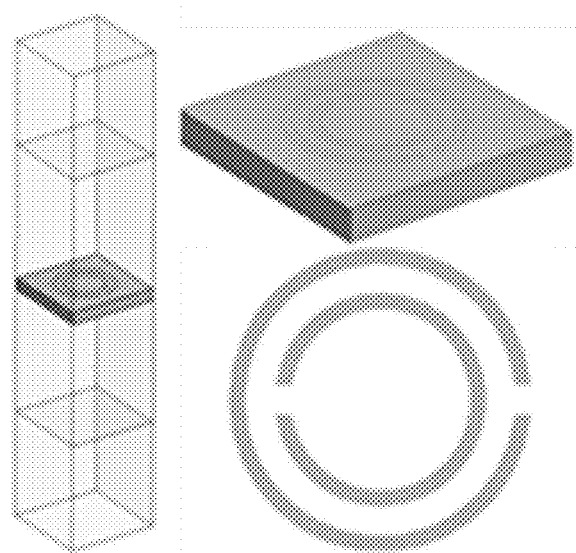
FIG. 4 is a COMSOL simulation model for a Complimentary Split-Ring Resonator (CSRR).
Figure 5:
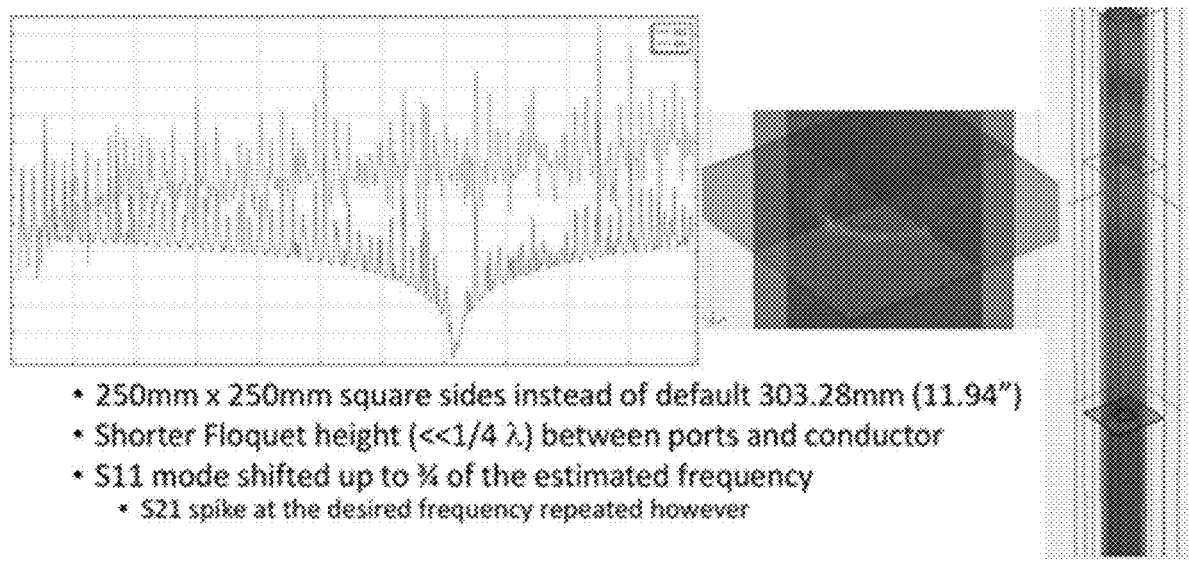
FIG. 5 shows an example COMSOL simulation output for a frequency distinct result set for the CSRR model of FIG. 4.

A preferably 3D-printed embedded RF responsive structure, or Complimentary Split-Ring Resonator (CSRR), can address problematic frequencies that are known or that are discovered during testing. For the present invention design and analysis of a CSRR using a Solidworks-COMSOL model is used to assess parameters such as transmitted frequency, antenna aperture geometry, size and scale of the CSRR for filtering frequencies (bandpass or rejection), and perimeter square, corresponding to different materials and frequency range of interest. One example is shown in FIG. 4. A periodic Floquet boundary condition (BC) is preferably applied to the orthogonal walls of the single CSRR antenna, where the source and listener ports supply and receive radiated energy. The top and bottom layers above and below the split ring slot are preferably perfectly matched. The Floquet BC preferably drives the S11 (reflection) mode frequency. A sample output for S11 and S21 and the EM field is shown in FIG. 5 with the frequencies purposefully excluded. The CSSR may be 3D-printed using graphene or CNT inks.

The electrical conductivity of pure CNTs is $10^4$-$10^5$ S/cm and $10^6$ S/cm for pure GNS. These values compare with pure silver, copper, and aluminum metals, which have conductivities of $6.30\times10^5$, $5.96\times10^5$, and $3.77\times10^5$ S/cm, respectively. It is known that even 4 mils of high electrical conductivity copper does not meet military requirements for >70 dB attenuation from 500 MHz-100 GHz. It is expected that the present invention will require only about 1/10 the mass of aluminum for the same shielding effectiveness. Table 1 provides some relevant materials properties.

TABLE 1

| | ρ | E | E/ρ | $\sigma_t$ | $\sigma_t/\rho$ | α | k | $\kappa_e$ |
|---|---|---|---|---|---|---|---|---|
| | | | | | Room Temperature Property | | | |
| | Density | Modulus Young's | Stiffness Specific | Strength Tensile | Strength Specific | Expansion Thermal | Conductivity Thermal | Conductivity Electrical |
| Units: | kg/m³ | GPa | MPa-m³/kg | Mpa | MPa-m³/kg | $10^{-6}$/K | W/m-K | $10^6$ S/m |
| Preferred Value: | Small | Large | Large | Large | Large | Small | Large | Large |
| Carbon Nanotube | 2100 | 1060 | 505 | 100000 | 47.62 | −12 | 3000 | 1 to 10 |
| Graphene Nanosheet | 2100 | 1000 | 476 | 130000 | 61.90 | −8 | 3000 | 1 to 10 |
| C/Epoxy 50% Sheet | 1600 | 70 | 44 | 600 | 0.38 | 2.1 | 150 | 0.03 |
| Steel | 7900 | 200 | 25 | 420 | 0.05 | 11.7 | 50 | 1.45 |
| Aluminum: 7075 T6 | 2740 | 71 | 26 | 503 | 0.18 | 26 | 121 | 36.9 |
| OFHC Copper | 8940 | 117 | 13 | 379 | 0.04 | 17 | 390 | 58 |

With respect to EM shielding, Table 1 shows that aluminum is an excellent choice, not only for its mass and electrical conductivity but also because it is a low Z material. Using Clemson's online Shielding Effectiveness Calculator (https://cecas.clemson.edu/cvel/emc/calculators/SE_Calculator/index.html), the plane wave shielding effectiveness of various materials can be calculated using the equation:

$$S.E. = 20\log\frac{\eta_0}{4\eta_s} + 20\log e^{t/\delta} = R(dB) + A(dB)$$

Figure 6:
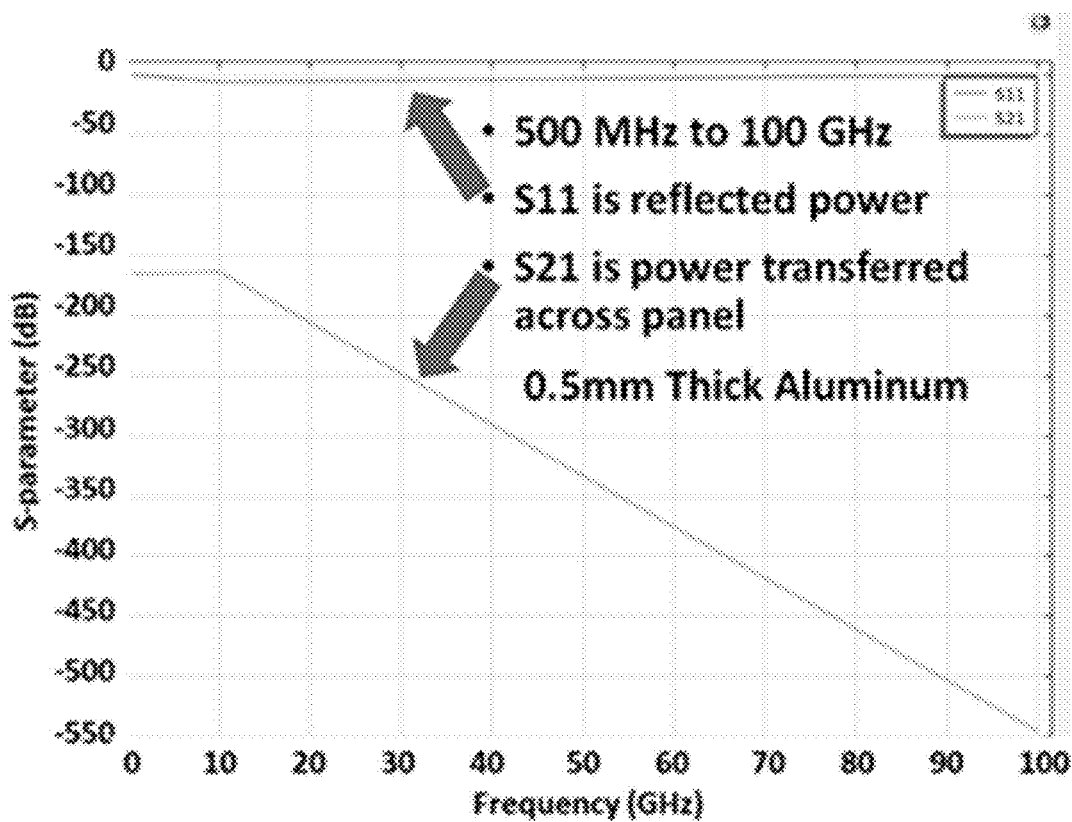
FIG. 6 shows results of a COMSOL model for S-parameters for 0.5 mm aluminum from 500 MHz to 100 GHz.

Using properties from Table 1, the SE for 1 square foot of material (0.0929 m²) of aluminum (Al), horizontally-aligned CNTs, and GNS as a function of thickness for frequencies of 0.5 and 100 GHz can be calculated. The horizontally-aligned CNT component of the orthogonal nanoforest is preferably designed for maximum conductivity, and a thickness of about 50 microns is typical. The relative permeability of the horizontally-aligned CNT and GNS was valued as 4, and Al was 1. The SE calculation results are shown in Table 2; the SE values include both reflection and absorption components. COMSOL was used to model Al plates with 0.5, 1, and 10 mm thickness across the 0.5-100 GHz frequency spectrum for an infinite plane Floquet BC; the example COMSOL output for 0.5 mm thick Al plates is shown in FIG. 6. Based on the SE values in Table 2, to get equivalent performance, an EMI/EMP shield of the present invention that comprises GNS nanoparticulates will preferably be less than about 0.25 mm (250 microns) in thickness.

TABLE 2

| Shield Layer Thickness (μm) | Low Z Aluminum | Low Z horizontally-aligned CNT | Low Z GNS |
|---|---|---|---|
| | SE (dB) for 0.5 GHZ / SE (dB) for 100 GHz/Mass (kg) | | |
| 50 (0.05 mm) | 198/1716/ 0.0127 | 190/1773/ 0.00975 | 465/1773/ 0.00975 |
| 500 (0.5 mm) | 1267/16659/ 0.127 | 1290/17730/ 0.0975 | 3943/17730/ 0.0975 |
| 5000 (5 mm) | 11961/166084/ 1.27 | 12291/172906/ 0.975 | 38731/546691/ 0.975 |

Shielding results in the literature for carbon in the 2-18 GHz range for graphene films with a bi-continuous nanoporosity had EMI SE (SSE/t) of 50.9 dB (75,407 dB cm²/g) and 83 dB (61,630 dB cm²/g). As expected, at higher frequencies for an appreciable thickness (500 microns), the absorption losses greatly exceed the reflection loss component of the SE for all the materials. The order of magnitude higher electrical conductivity of GNS results in the highest SE, from 2.35 to 3.24 times higher than Al, depending on thickness. The horizontally-aligned CNT and GNS have a 24% lower density than Al, but GNS can be nominally 1/3 the thickness for the equivalent SE, and thus only 1/4$^{th}$ the mass of Al. It is expected that the orthogonal nanoforest will only be 1/10$^{th}$ the mass of Al and will simultaneously achieve an electrical conductivity of 3000 S/cm and attenuation >70 dB across the 500 MHz-100 GHz. The channels between neighboring CNTs in the vertically-aligned CNT component of the present invention provide exposure to a vast surface area of conductive surfaces (both CNT walls and the nanoparticulates in the resin matrix) in 3-dimensions, increasing internal reflections of EM waves and volumetrically enhancing the EM wave absorption by converting induced currents to heat, dielectric relaxation, and tunneling currents. One or more CSRRs, preferably 3D-printed on the composite, may be used to clean up leakage.

There are many possibilities for original, EMI/EMP dedicated electronics packaging designs using the EMI/EMP shields of the present invention. Native orthogonal nanoforest/GNS nanoparticulate composite panels containing bonded-in, CTE-matched (titanium, Invar, Kovar) mounting, fastening and structural features can support a variety of internal components and configurations. A Faraday-caged avionics package will comply with full-spectrum EMI and EMC-TEMPEST environmental requirements, using EMI-filtered interconnects (for signal and power) as well as ventilation and crossflow convection cooling screens (for redundancy) whose openings would scale to shield the entire frequency of interest. Existing avionics and aircraft avionics cabinets can be retrofitted; the structural chassis walls may be replaced with the nanocomposite of the present invention. Alternatively, adhesive-backed, trim-to-fit, flexible nanocomposite panels of the present invention can be cut, formed, and bent to shape, then conductively bonded to existing chassis and cabinet walls. Or, broad-spectrum EMI/EMP shielding treatments may be applied directly onto prepared (and electrically grounded) conductive metal surfaces using a spray-on aerosol delivery system. The composite would be cured in situ after spraying.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A radiation shield comprising a nanoforest comprising vertically-oriented carbon nanotubes, the nanoforest embedded in a matrix comprising nanoparticulates;
   wherein the nanoforest is disposed on a base, the base comprising a second nanoforest comprising horizontally-oriented carbon nanotubes.

2. The radiation shield of claim 1 wherein the nanoparticulates are nanoparticles, carbon nanotubes, or graphene nanosheets.

3. The radiation shield of claim 1 wherein the nanoparticulates comprise one or more materials selected from the group consisting of graphene, modified graphene, functionalized graphene oxide, gold, silver, copper, aluminum, and platinum.

4. The radiation shield of claim 1 wherein the matrix comprises a solidified polymer, epoxy, resin, or ceramic precursor.

5. The radiation shield of claim 1 wherein the nanoparticulates are low atomic number (low-Z).

6. The radiation shield of claim 1 capable of shielding an object from radio frequency interference (RFI) (e.g., 5G), lightning, microwave transmissions, electromagnetic radiation, electromagnetic interference (EMI), electromagnetic pulse (EMP), High-altitude Electromagnetic Pulse (HEMP), Vertical EMP (VEMP), flash X-rays, gamma rays, X-rays, and/or neutrons.

7. The radiation shield of claim 1 comprising high atomic number (high-Z) nanoparticulates, thereby enabling the radiation shield to shield an object from protons.

8. The radiation shield of claim 1 wherein the matrix comprises a ceramic.

9. The radiation shield of claim 8 wherein the ceramic is silicon carbide.

10. The radiation shield of claim 1 wherein a concentration of nanoparticulates in the matrix is greater than approximately 3.2 wt %.

11. The radiation shield of claim 10 wherein the concentration of nanoparticulates in the matrix is greater than approximately 30 wt %.

12. The radiation shield of claim 11 wherein the concentration of nanoparticulates in the matrix is greater than or equal to approximately 60 wt %.

13. The radiation shield of claim 1 wherein the vertically-oriented carbon nanotubes are between about 25 microns and about 4 mm in length.

14. The radiation shield of claim 1 wherein the base comprises sufficient in-plane electrical conductivity to provide an effective conductive path for currents induced by radiation absorption.

15. The radiation shield of claim 1 wherein a thickness of the second nanoforest is between about 40 microns and about 70 microns.

16. The radiation shield of claim 1 wherein the base is configured to adhere to an object to be shielded.

17. The radiation shield of claim 1 comprising approximately 10% of a mass of aluminum providing equivalent shielding.

* * * * *